US012710376B2

(12) United States Patent
Yonemichi et al.

(10) Patent No.: US 12,710,376 B2
(45) Date of Patent: Aug. 18, 2026

(54) DATA PROCESSING APPARATUS AND METHOD FOR IMAGING TIME SERIES DATA OF MULTIPLE WAVELENGTHS

(71) Applicant: Tokyo Electron Limited, Tokyo (JP)

(72) Inventors: Hitoshi Yonemichi, Sapporo City (JP); Hisanori Sakai, Kurokawa-gun (JP); Takeshi Akimoto, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 662 days.

(21) Appl. No.: 18/085,591

(22) Filed: Dec. 21, 2022

(65) Prior Publication Data

US 2023/0118026 A1 Apr. 20, 2023

Related U.S. Application Data

(63) Continuation of application No. PCT/JP2021/025335, filed on Jul. 5, 2021.

(30) Foreign Application Priority Data

Jul. 16, 2020 (JP) ................................ 2020-122172

(51) Int. Cl.
*G01N 21/95* (2006.01)
*G06T 7/00* (2017.01)
(Continued)

(52) U.S. Cl.
CPC ....... *G01N 21/9501* (2013.01); *G06T 7/0004* (2013.01); *G06T 11/10* (2026.01);
(Continued)

(58) Field of Classification Search
CPC .............. G01N 21/9501; G06T 7/0004; G06T 2207/10024; G06T 2207/20081; G06T 2207/30148
See application file for complete search history.

(56) References Cited

U.S. PATENT DOCUMENTS 6,238,937 B1 * 5/2001 Toprac .................. G01N 21/71 257/E21.528

FOREIGN PATENT DOCUMENTS

JP 2003-509839 A 3/2003
JP 2013-161913 A 8/2013
(Continued)

OTHER PUBLICATIONS

"Data Preprocessing" ( https://m.blog.naver.com/koys007/221264115719) Apr. 29, 2018 blog publication (computer-generated English translation only).

(Continued)

*Primary Examiner* — Matthew C Bella
*Assistant Examiner* — Jinsu Hwang
(74) *Attorney, Agent, or Firm* — XSENSUS LLP

(57) ABSTRACT

A data processing apparatus comprises processing circuitry configured to generate normalized data by normalizing time series data of multiple wavelengths, measured from a substrate, by using predetermined reference data; divide the normalized data into a plurality of regions for each predetermined time range and predetermined wavelength range; for each respective region of the plurality of regions, extract an outlier value in the respective region as a representative value; and convert the representative values from the plurality of regions into color data to generate image data from the color data.

17 Claims, 15 Drawing Sheets

(51) Int. Cl.
*G06T 11/10* (2026.01)
*H10P 72/00* (2026.01)

(52) U.S. Cl.
CPC .................... *H10P 72/0604* (2026.01); *G06T 2207/10024* (2013.01); *G06T 2207/20081* (2013.01); *G06T 2207/30148* (2013.01)

(56) References Cited

FOREIGN PATENT DOCUMENTS

| | | | | |
|---|---|---|---|---|
| KR | 10-1780874 | 9/2021 | | |
| WO | WO-2017087140 A1 * | 5/2017 | ........... | G06T 7/0004 |

OTHER PUBLICATIONS

"IoT Data Visualization (3)—Information Visualization", MDS Intelligence ( https://blog.naver.com/mds_datasecurity/221968172361 ) May 18, 2020 blog publication (computer-generated English translation only).
"Artificial Intelligence, machine learning, and data mining—what's the difference?", Samsung Display Newsroom (https://news.samsungdisplay.com/12538) Jan. 2, 2018 (computer-generated English translation only).
International Search Report and Written Opinion mailed on Sep. 28, 2021, received for PCT Application PCT/JP2021/025335, filed on Jul. 5, 2021, 8 pages including English Translation.

* cited by examiner

100
SEMICONDUCTOR MANUFACTURING PROCESS
UNPROCESSED WAFER
110
PROCESSING SPACE
120
PROCESSED WAFER
130
LIGHT EMISSION SPECTROSCOPY ANALYZER
140
OES DATA
DATA PROCESSING APPARATUS
150
OES DATA STORAGE UNIT
155
PRE-PROCESSOR
151
COMPRESSION UNIT
152
IMAGING UNIT
153
DISPLAY CONTROLLER
154
IMAGE DATA STORAGE UNIT
156

150
DATA PROCESSING APPARATUS
301
CPU
302
ROM
303
RAM
304
GPU
305
AUXILIARY STORAGE DEVICE
306
DISPLAY DEVICE
307
OPERATING DEVICE
308
I/F DEVICE
309
DRIVE DEVICE
310
320
RECORDING MEDIUM

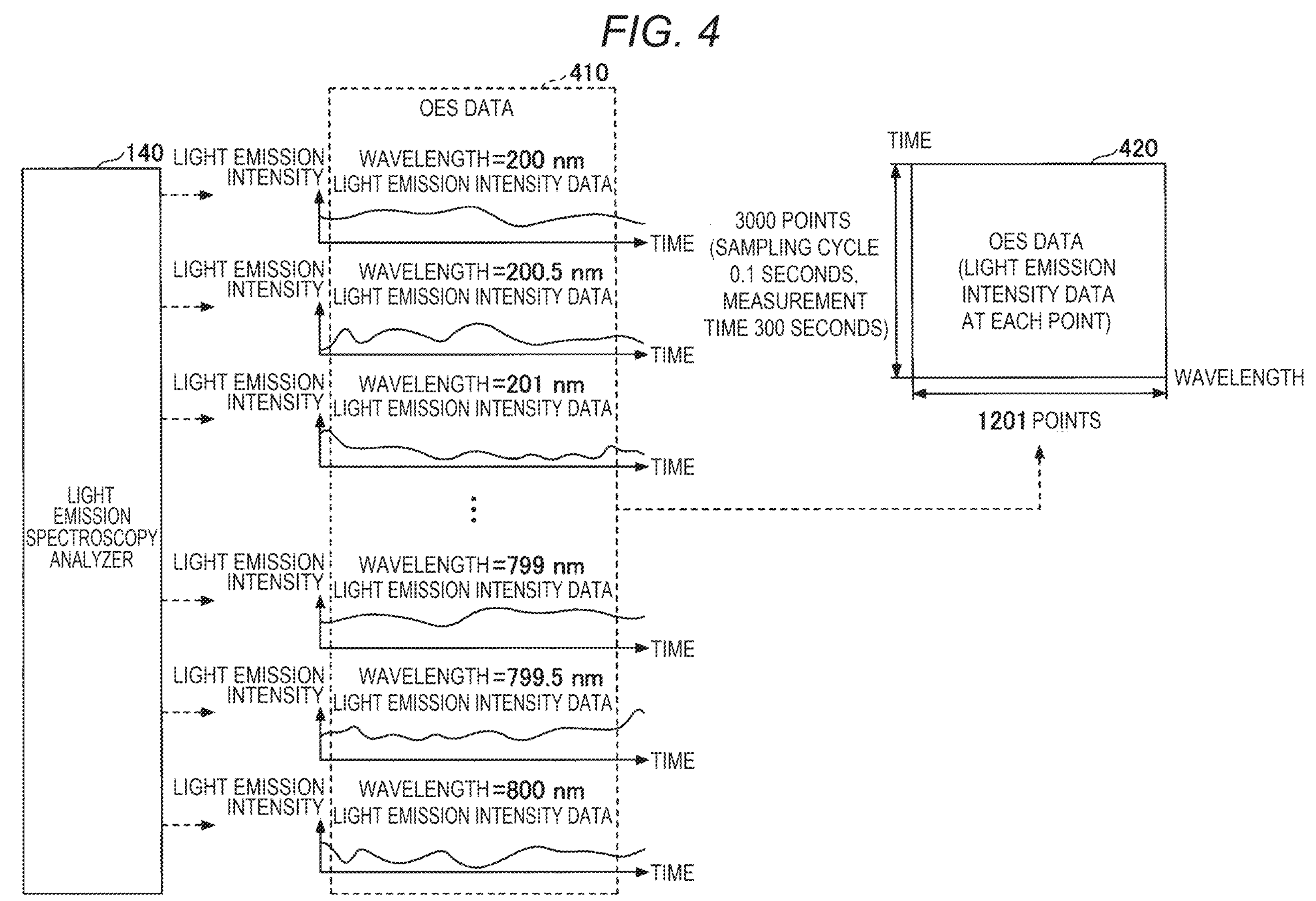
FIG. 4
140
LIGHT EMISSION SPECTROSCOPY ANALYZER
410
OES DATA
LIGHT EMISSION INTENSITY
WAVELENGTH =200 nm
LIGHT EMISSION INTENSITY DATA
TIME
LIGHT EMISSION INTENSITY
WAVELENGTH =200.5 nm
LIGHT EMISSION INTENSITY DATA
TIME
LIGHT EMISSION INTENSITY
WAVELENGTH =201 nm
LIGHT EMISSION INTENSITY DATA
TIME
LIGHT EMISSION INTENSITY
WAVELENGTH =799 nm
LIGHT EMISSION INTENSITY DATA
TIME
LIGHT EMISSION INTENSITY
WAVELENGTH =799.5 nm
LIGHT EMISSION INTENSITY DATA
TIME
LIGHT EMISSION INTENSITY
WAVELENGTH =800 nm
LIGHT EMISSION INTENSITY DATA
TIME
3000 POINTS (SAMPLING CYCLE 0.1 SECONDS, MEASUREMENT TIME 300 SECONDS)
TIME
420
OES DATA (LIGHT EMISSION INTENSITY DATA AT EACH POINT)
WAVELENGTH
1201 POINTS

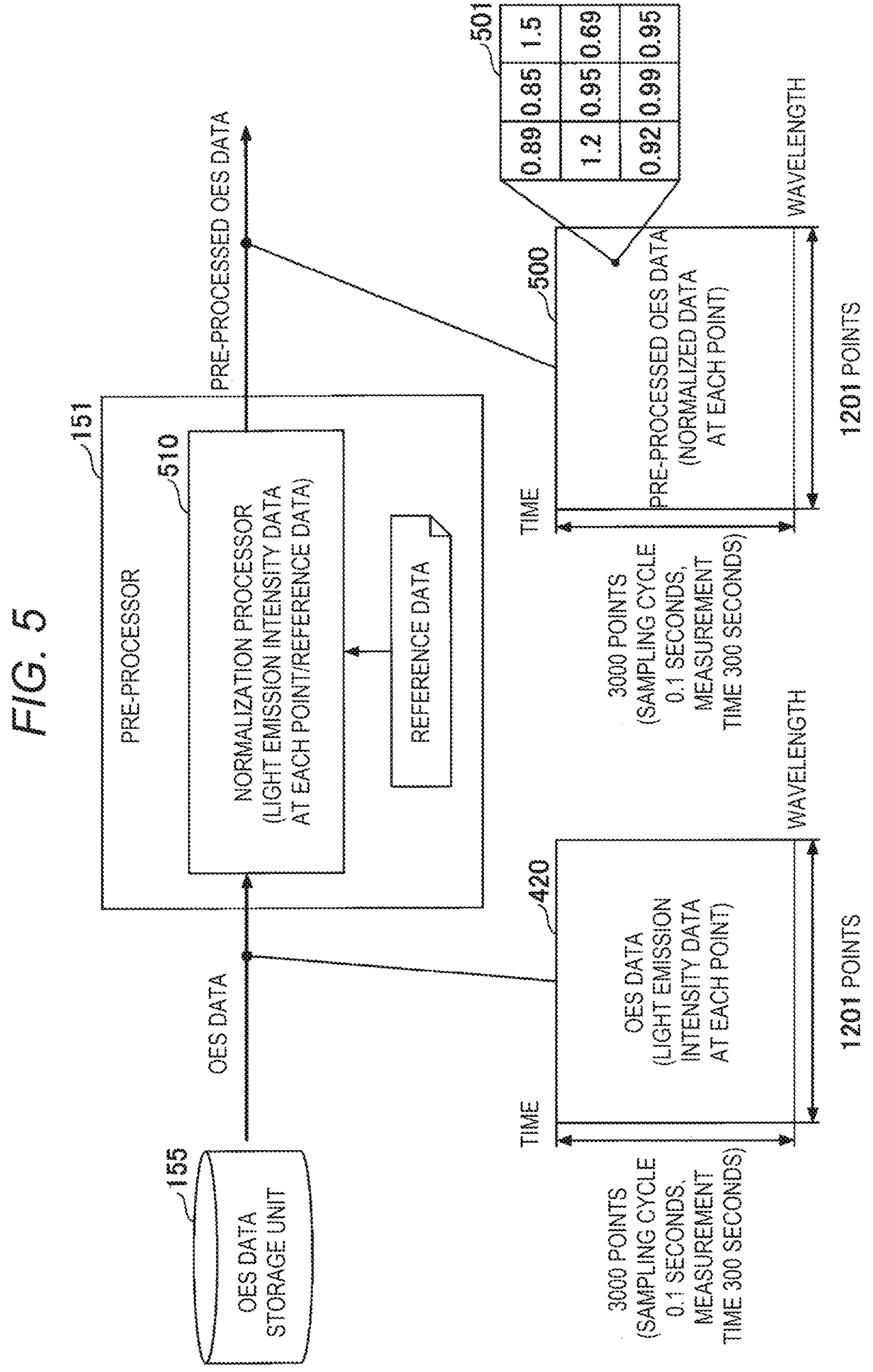
FIG. 5
155
OES DATA STORAGE UNIT
OES DATA
151
PRE-PROCESSOR
510
NORMALIZATION PROCESSOR (LIGHT EMISSION INTENSITY DATA AT EACH POINT/REFERENCE DATA)
REFERENCE DATA
PRE-PROCESSED OES DATA
420
OES DATA (LIGHT EMISSION INTENSITY DATA AT EACH POINT)
TIME
WAVELENGTH
1201 POINTS
3000 POINTS (SAMPLING CYCLE 0.1 SECONDS, MEASUREMENT TIME 300 SECONDS)
500
PRE-PROCESSED OES DATA (NORMALIZED DATA AT EACH POINT)
TIME
WAVELENGTH
1201 POINTS
3000 POINTS (SAMPLING CYCLE 0.1 SECONDS, MEASUREMENT TIME 300 SECONDS)
501
0.89 0.85 1.5
1.2 0.95 0.69
0.92 0.99 0.95

152
COMPRESSION UNIT
610
AVERAGE CALCULATION UNIT
620
REPRESENTATIVE VALUE EXTRACTION UNIT
PRE-PROCESSED OES DATA
COMPRESSED OES DATA
500
PRE-PROCESSED OES DATA (NORMALIZED DATA AT EACH POINT)
TIME
WAVELENGTH
1201 POINTS
3000 POINTS (SAMPLING CYCLE 0.1 SECONDS, MEASUREMENT TIME 300 SECONDS)
501
0.89
0.85
1.5
1.2
0.95
0.69
0.92
0.99
0.95
600
COMPRESSED OES DATA (COMPRESSED DATA AT EACH POINT)
TIME
WAVELENGTH
400 POINTS
1000 POINTS
601
1.5
AVERAGE VALUE: 0.99

900
SEMICONDUCTOR MANUFACTURING PROCESS
UNPROCESSED WAFER
110
PROCESSING SPACE
120
PROCESSED WAFER
130
LIGHT EMISSION SPECTROSCOPY ANALYZER
140
OES DATA
RECIPES
PROCESSING RESULT INFORMATION
DATA PROCESSING APPARATUS
920
OES DATA STORAGE UNIT
155
PRE-PROCESSOR
151
COMPRESSION UNIT
152
IMAGING UNIT
153
IMAGE DATA STORAGE UNIT
156
TRAINING DATA STORAGE UNIT
923
LEARNING UNIT
921
INFERENCE UNIT
922

900'
SEMICONDUCTOR MANUFACTURING PROCESS
110
UNPROCESSED WAFER
120
PROCESSING SPACE
130
PROCESSED WAFER
140
LIGHT EMISSION SPECTROSCOPY ANALYZER
OES DATA
RECIPES
920
DATA PROCESSING APPARATUS
155
OES DATA STORAGE UNIT
151
PRE-PROCESSOR
152
COMPRESSION UNIT
923
TRAINING DATA STORAGE UNIT
921
LEARNING UNIT
153
IMAGING UNIT
156
IMAGE DATA STORAGE UNIT
922
INFERENCE UNIT

| TRAINING DATA | | | | |
|---|---|---|---|---|
| APPARATUS | RECIPE | WAFER | IMAGE DATA | NON-DEFECTIVE/ERRONEOUS |
| CHAMBER A | RECIPE 1 | WAFER 1 | IMAGE DATA 1 | NON-DEFECTIVE |
| | | WAFER 2 | IMAGE DATA 2 | NON-DEFECTIVE |
| | | WAFER 3 | IMAGE DATA 3 | NON-DEFECTIVE |
| | | WAFER 4 | IMAGE DATA 4 | INCLUDING ERROR (PATTERN a) |
| | RECIPE 2 | WAFER 5 | IMAGE DATA 5 | NON-DEFECTIVE |
| | | WAFER 6 | IMAGE DATA 6 | INCLUDING ERROR (PATTERN b) |
| | | WAFER 7 | IMAGE DATA 7 | NON-DEFECTIVE |
| | | WAFER 8 | IMAGE DATA 8 | NON-DEFECTIVE |
| | | WAFER 9 | IMAGE DATA 9 | INCLUDING ERROR (PATTERN c) |
| | | | | |

DATA PROCESSING APPARATUS AND METHOD FOR IMAGING TIME SERIES DATA OF MULTIPLE WAVELENGTHS

CROSS-REFERENCE TO RELATED APPLICATIONS

This application is a bypass continuation application of international application No. PCT/JP2021/025335, filed on Jul. 5, 2021, which claims the benefit of priority from Japanese Patent Application No. 2020-122172, filed on Jul. 16, 2020, the entire contents of each of which are incorporated herein by reference.

TECHNICAL FIELD

The present disclosure relates to a data processing apparatus, a data processing system, a data processing method, and a data processing program.

BACKGROUND

In the measurement data measured during the performance of a semiconductor manufacturing process, for example, measurement data measured by a light emission spectroscopy analyzer, a mass spectrometer, or the like (so-called time series data of multiple wavelengths) generally has high measurement resolution and an enormous amount of data. Therefore, a management cost for managing the data is incurred. In addition, in the case of time series data of multiple wavelengths, it is difficult for a user to directly determine presence or absence of an error occurrence or the like.

On the other hand, for example, when time series data of multiple wavelengths is imaged and displayed, it is considered that the user can easily determine the presence or absence of the error occurrence or the like. Further, if the imaged data is compressed and managed, the management cost may be reduced.

However, in the case of time series data of multiple wavelengths, when displaying imaged data or when compressing the imaged data, there is a possibility that feature data indicative of the presence or absence of the error occurrence may be lost.

SUMMARY

A data processing apparatus according to the present disclosure includes processing circuitry configured to generate normalized data by normalizing time series data of multiple wavelengths, measured from a substrate, by using predetermined reference data; divide the normalized data into a plurality of regions for each predetermined time range and predetermined wavelength range; for each respective region of the plurality of regions, extract an outlier value in the respective region as a representative value; and convert the representative values from the plurality of regions into color data to generate image data from the color data.

BRIEF DESCRIPTION OF DRAWINGS

FIG. 4 is a diagram illustrating an example of optical emission spectroscopy data.

FIG. 5 is a diagram illustrating a specific example of processing by a pre-processor.

FIG. 10 is a diagram illustrating an example of training data.

DETAILED DESCRIPTION

The present disclosure provides a data processing apparatus, a data processing system, a data processing method, and a data processing program which compress time series data of multiple wavelengths with reduced loss of feature data to form an image.

A data processing apparatus according to an embodiment of the present disclosure may have the following configuration. That is, the data processing apparatus includes a pre-processor that generates normalized data by normalizing time series data of multiple wavelengths by using predetermined reference data, an extraction unit that divides the normalized data into a plurality of regions for each predetermined time range and predetermined wavelength range to extract an outlier value in each region as a representative value, and a generator that converts the representative value of each region into color data to generate image data.

According to the present disclosure, it is possible to provide a data processing apparatus, a data processing system, a data processing method, and a data processing program that compress time series data of multiple wavelengths with reduced loss of feature data to form an image.

In the following, embodiments of the present invention will be described with reference to the accompanying drawings. In the specification and drawings, elements having substantially the same functions or configurations are referred to by the same numerals, and a duplicate description thereof will be omitted.

First Embodiment

System Configuration of Data Processing System

Figure 1:
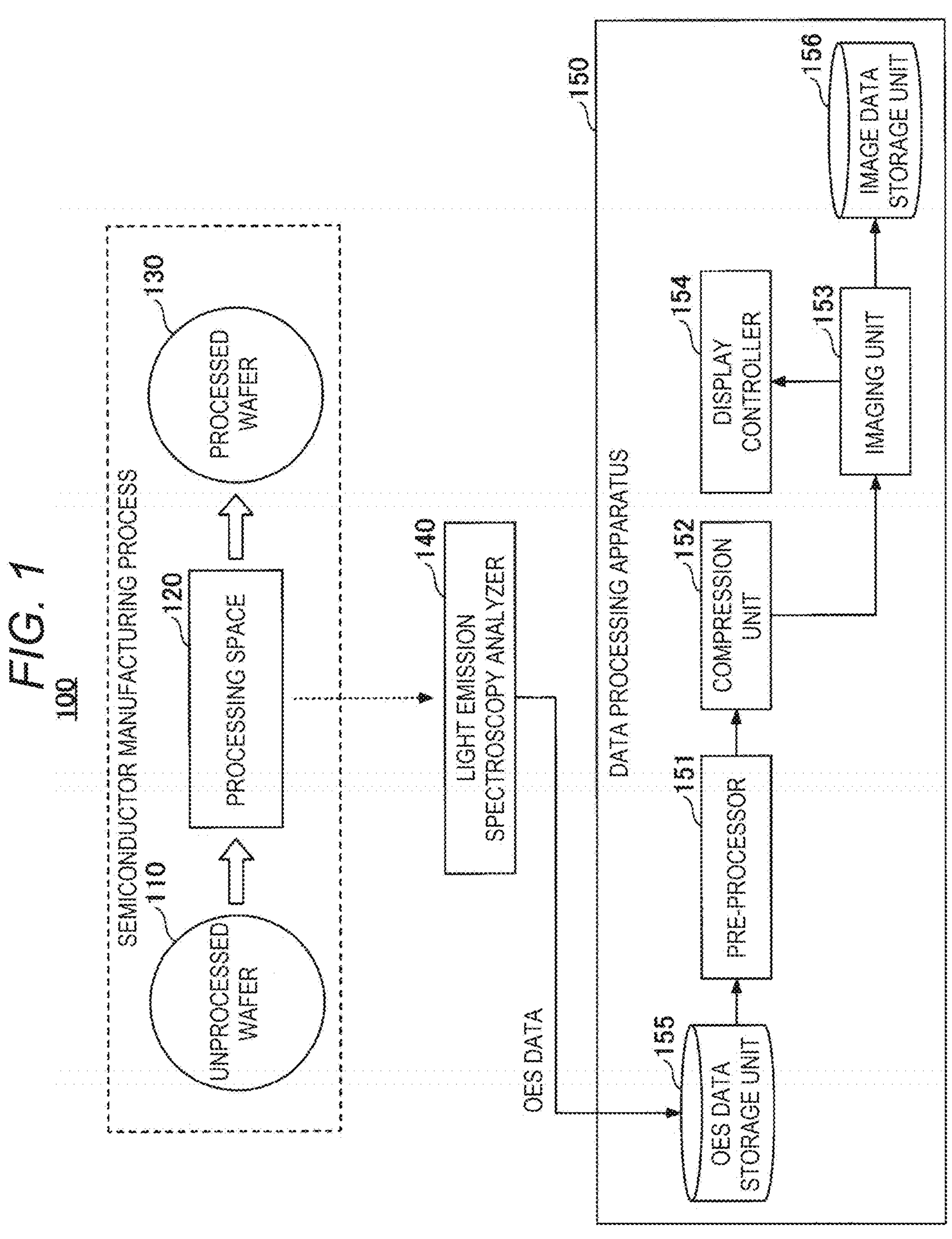
FIG. 1 is a first diagram illustrating an example of a system configuration of a data processing system.

First, the system configuration of a data processing system according to a first embodiment will be described. FIG. 1 is a first diagram illustrating an example of a system configuration of a data processing system. As shown in FIG. 1, a data processing system 100 includes a light emission spectroscopy analyzer 140 and a data processing apparatus 150, and the data processing system 100 is used for a semiconductor manufacturing process.

In the semiconductor manufacturing process, an object (unprocessed wafer 110) is processed in a predetermined processing space 120 to generate a resultant object (processed wafer 130). The unprocessed wafer 110 referred to herein refers to a wafer (substrate) before being processed in the processing space 120, and the processed wafer 130 refers to a wafer (substrate) after being processed in the processing space 120.

The light emission spectroscopy analyzer 140 measures optical emission spectroscopy (OES) data as the unprocessed wafer 110 is processed in the processing space 120. The OES data is "time series data of multiple wavelengths" that includes light emission intensity data at each time point, which is a number corresponding to the number of measurement wavelengths.

The OES data measured by the light emission spectroscopy analyzer 140 is stored in an OES data storage unit 155 of the data processing apparatus 150.

A data processing program is installed in the data processing apparatus 150, and when the program is executed, the data processing apparatus 150 functions as a pre-processor 151, a compression unit 152, an imaging unit 153, and a display controller 154. In an exemplary implementation, pre-processor 151, compression unit 152, imaging unit 153, display controller 154, OES data storage unit 155 and/or image data storage unit 156 of data processing apparatus 150 may be executed by, or encompassed in, processing circuitry. The processing circuitry of data processing apparatus 150 will be discussed later with respect to FIG. 3.

The pre-processor 151 reads the OES data from the OES data storage unit 155, and performs pre-processing (for example, normalization processing) by using predetermined reference data. Further, the pre-processor 151 notifies the compression unit 152 of pre-processed OES data.

The compression unit 152 compresses the pre-processed OES data, and notifies the imaging unit 153 of the compressed OES data. Specifically, the compression unit 152 divides the pre-processed OES data into a plurality of regions each having a predetermined size (a predetermined time range and a predetermined wavelength range), and extracts an outlier value included in each region as a representative value of each region, thereby compressing the pre-processed OES data. The outlier values refer to values that are statistically far off the other values in each region. As described above, by compressing the OES data after the pre-processing while leaving the outlier values included in each region, it is possible to suppress the loss of the feature data (feature data indicative of an error occurrence) included in the OES data.

The imaging unit 153 converts the compressed OES data notified from the compression unit 152 into color data to generate image data. The imaging unit 153 stores the generated image data in an image data storage unit 156 and notifies the display controller 154 of the image data. As a result, the image data storage unit 156 may store image data whose data amount is significantly reduced compared to the OES data, thereby reducing the management cost.

The display controller 154 controls a display device to display the image data generated by the imaging unit 153. As described above, since the image data generated by the imaging unit 153 is compressed, the image data can be displayed on the display device without further processing regardless of whether the number of pixels of the display device is limited. In other words, it is possible to avoid a situation where, for example, image data is thinned out and feature data is lost when the image data is displayed on the display device.

Since the loss of feature data is suppressed in the image data generated by the imaging unit 153, the user can visually determine presence or absence of an error occurrence or the like on the image data to be displayed on the display device.

Processing Space in Semiconductor Manufacturing Process

Figure 2:
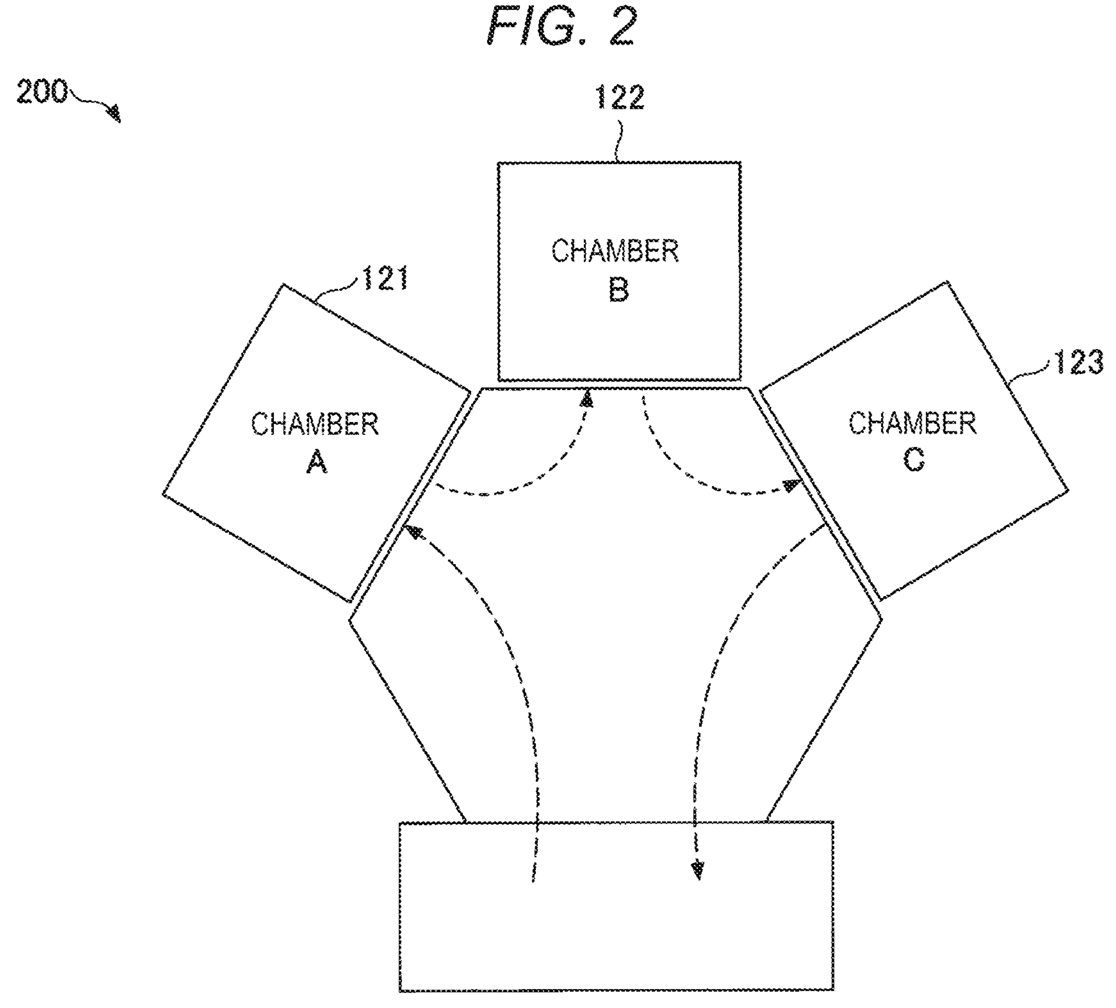
FIG. 2 is a diagram illustrating an example of a semiconductor manufacturing process.

Next, a predetermined processing space of the semiconductor manufacturing process will be described. FIG. 2 is a diagram illustrating an example of a semiconductor manufacturing process. As shown in FIG. 2, a semiconductor manufacturing process 200 includes a plurality of chambers, which are examples of processing spaces. In the example of FIG. 2, the semiconductor manufacturing process 200 includes three chambers denoted by reference numeral 121 ("chamber A"), 122 ("chamber B") and 123 ("chamber C"), and the unprocessed wafer 110 is processed in each chamber.

In the semiconductor manufacturing process 200, the above-described light emission spectroscopy analyzer 140 is installed for each chamber, and OES data is measured in each chamber. In the following, however, in order to simplify the description, a case of displaying the OES data measured in one chamber will be described. Hereinafter, the one chamber will be described as a chamber A. Further, hereinafter, the chamber A will be described as being, for example, a chamber of an etching apparatus.

Hardware Configuration of Data Processing Apparatus

Figure 3:
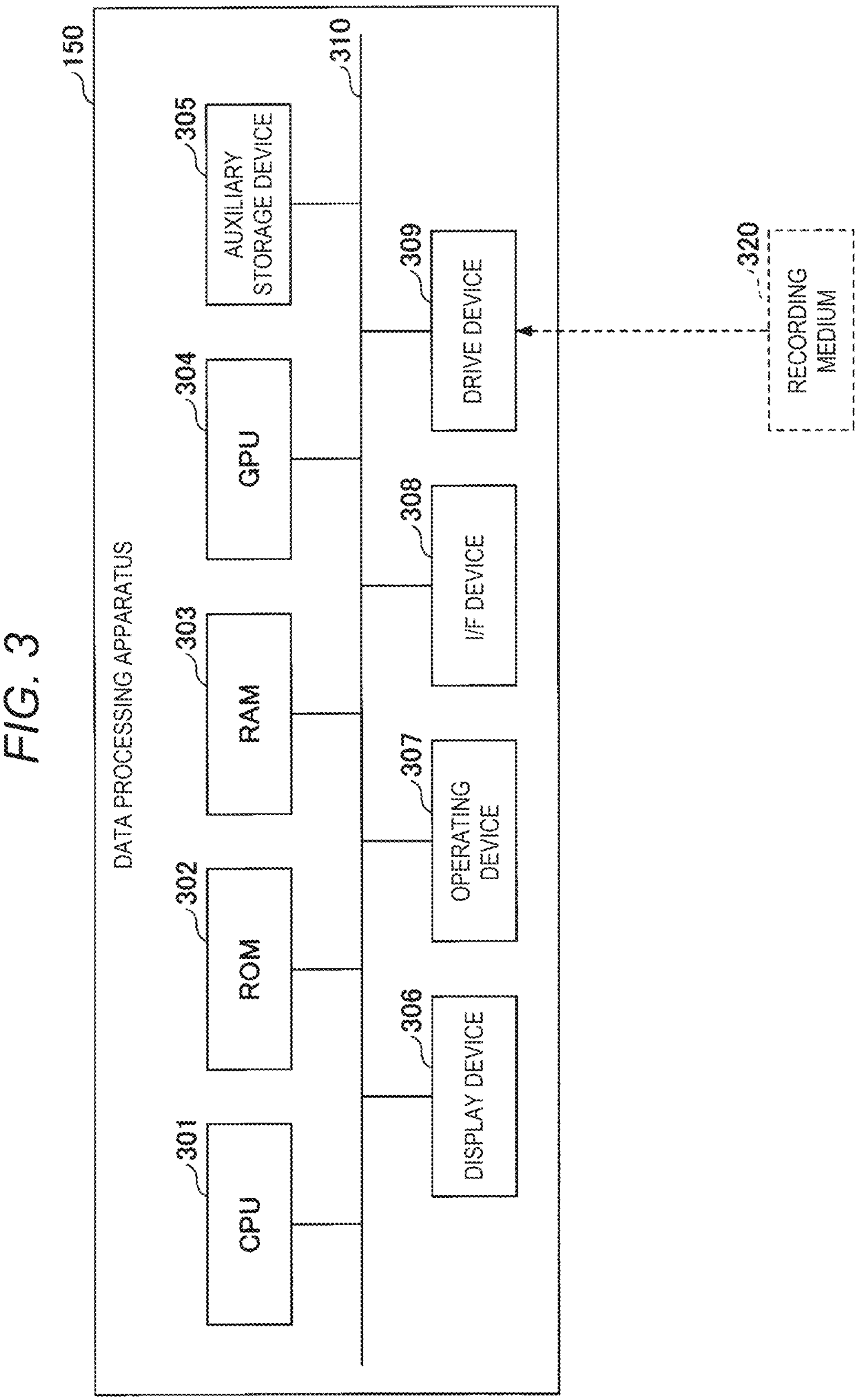
FIG. 3 is a diagram illustrating an example of a hardware configuration of a data processing apparatus.

In the following, the hardware configuration of the data processing apparatus 150 will be described. FIG. 3 is a diagram illustrating an example of a hardware configuration of a data processing apparatus. As illustrated in FIG. 3, the data processing apparatus 150 includes a central processing unit (CPU) 301, a read only memory (ROM) 302, and a random access memory (RAM) 303. Further, the data processing apparatus 150 includes a graphics processing unit (GPU) 304. The processors (i.e., processing circuits, circuitry or processing circuitry) such as the CPU 301 and the GPU 304 and the memories such as the ROM 302 and the RAM 303 constitute components of data processing apparatus 150.

The data processing apparatus 150 further includes an auxiliary storage device 305, a display device 306, an operating device 307, an I/F (interface) device 308, and a drive device 309. The hardware components of the data processing apparatus 150 are coupled to each other through a bus 310.

The CPU 301 is an arithmetic device which executes various types of programs (for example, a data processing program and the like) installed in the auxiliary storage device 305.

The ROM 302 is a nonvolatile memory, and serves as a main memory device. The ROM 302 stores various types of programs, data, and the like necessary for the CPU 301 to execute the various types of programs installed in the auxiliary storage device 305. Specifically, the ROM 302 stores boot programs and the like such as BIOS (basic input/output system) and EFI (extensible firmware interface).

The RAM 303 is a volatile memory such as a DRAM (dynamic random access memory) and an SRAM (static random access memory), and serves as a main memory device. The RAM 303 provides a work area to which the various types of programs installed in the auxiliary storage device 305 are loaded when executed by the CPU 301.

The GPU 304 is an arithmetic device for image processing, and in the present embodiment, when a data processing program is executed by the CPU 301, the GPU 304 performs high-speed arithmetic operations based on parallel processing on the OES data. The GPU 304 includes an internal memory (GPU memory), which temporarily holds information necessary to perform parallel processing on the OES data.

The auxiliary storage device 305 stores various types of program, and stores various types of data and the like used when the various types of program are executed by the CPU 301. For example, the OES data storage unit 155 and the image data storage unit 156 are implemented in the auxiliary storage device 305.

The display device 306 is, for example, a display device that displays image data generated by the imaging unit 153. The operating device 307 is an input device used by the user of the data processing apparatus 150 to input various types of instructions into the data processing apparatus 150. The I/F device 308 is a connection device coupled to a network and configured to transmit and receive data to and from another apparatus (for example, a light emission spectroscopy analyzer or the like).

The drive device 309 is a device to which a recording medium 320 is set. Here, the recording medium 320 includes a medium for optically, electrically, or magnetically recording information, such as a CD-ROM, a flexible disk, a magneto-optical disk, or the like. The recording medium 320 may also include a semiconductor memory or the like that electrically records information, such as a ROM, a flash memory, or the like.

The various types of programs to be installed in the auxiliary storage device 305 are installed by the drive device 309 reading the various types of programs recorded in the recording medium 320 upon the recording medium 320 being supplied and set in the drive device 309, for example. Alternatively, the various types of program to be installed in the auxiliary storage device 305 may be installed upon being downloaded via a network.

Specific Example of OES Data

Next, a specific example of the OES data measured by the light emission spectroscopy analyzer 140 and stored in the OES data storage unit 155 of the data processing apparatus 150 will be described. FIG. 4 is a diagram illustrating an example of OES data. As shown in FIG. 4, OES data 410 is configured by a light emission intensity data group at each time point when each wavelength included in a wavelength range (200 nm to 800 nm) of visible light is measured at intervals of 0.5 nm. In the OES data 410, the horizontal axis represents time, and the vertical axis represents the light emission intensity of each wavelength.

In the case of the OES data 410 of FIG. 4, for example, the uppermost graph represents the light emission intensity data at each time point when the wavelength is 200 [nm], and the second graph represents the light emission intensity data at each time point when the wavelength is 200.5 [nm]. Further, the third graph represents the light emission intensity data at each time point when the wavelength is 201 [nm].

The time length of the OES data 410 is assumed to, for example, the processing time for which the unprocessed wafer 110 is processed in the chamber A (for one wafer). Alternatively, for example, when the unprocessed wafer 110 is processed by a plurality of processing steps in the chamber A, the time length of the OES data 410 may be the processing time of a part of the processing steps. Alternatively, for example, when a part of processing steps of the unprocessed wafer 110 are executed by a plurality of recipes in the chamber A, the time length of the OES data 410 may be the time for which the processing is executed by a part of the recipes.

Meanwhile, in FIG. 4, OES data 420 represents the arrangement of light emission intensity data at each point (each time point and each wavelength) with the wavelength on the horizontal axis and the time on the vertical axis. In the case of the OES data 420, light emission intensity data is arranged at 1201 points in the horizontal axis direction. Further, in the case of the OES data 420, when the sampling cycle of the light emission intensity data is 0.1 sec, and the processing time (for one wafer) for which the unprocessed wafer 110 is processed in the chamber A is 300 sec, the light emission intensity data is arranged at 3000 points in the vertical axis direction.

Therefore, if light emission intensity data at each point of the OES data 420 is converted into color data and the generated image data is to be displayed on the display device 306, a display device having 1201 pixels in the horizontal direction and 3000 pixels in the vertical direction is required.

On the other hand, when the number of pixels of the display device 306 is limited, the OES data 420 may be thinned out and displayed, and in this case, the feature data indicative of the error occurrence may be lost. Therefore, in the data processing apparatus 150 of the present embodiment, as described above, the OES data is pre-processed and compressed, and the compressed OES data is imaged to generate image data. As a result, regardless of whether the number of pixels of the display device 306 is limited, it is possible to avoid a situation in which image data is thinned out and feature data is lost when displayed in the display device 306.

Specific Example of Processing by Pre-Processor

In the following, a specific example of the processing performed on the OES data 420 by the pre-processor 151 of the data processing apparatus 150 will be described. FIG. 5 is a diagram illustrating a specific example of processing by a pre-processor. As shown in FIG. 5, the pre-processor 151 includes a normalization processor 510.

The normalization processor 510 reads the OES data 420 stored in the OES data storage unit 155, and normalizes the light emission intensity data at each point by dividing the light emission intensity data at each point included in the OES data 420 by using reference data.

For the reference data, for example, the average value of the light emission intensity data is used at each wavelength of OES data measured when a wafer serving as a reference (a wafer determined as a non-defective wafer) is processed. In this case, since it is possible to make apparent a difference with the wafer determined to be a non-defective wafer, it is easy to determine the presence or absence of the error occurrence when image data is generated.

Alternatively, for the reference data, the average value of the light emission intensity data of the wavelength that serves as a reference for the measured OES data may be used. In this case, since it is possible to make apparent at which wavelength the light emission intensity is relatively strong during the processing of the unprocessed wafer, it is easy to determine the presence or absence of the error occurrence when image data is generated.

In FIG. 5, pre-processed OES data 500 is an example of the pre-processed OES data in which the light emission intensity data at each point has been normalized by the normalization processor 510. In FIG. 5, normalized data 501 at each point represents the normalized data at each point included in the region of a predetermined size (three points in the horizontal axis direction and three points in the vertical axis direction) in the pre-processed OES data 500.

As shown in the normalized data 501 at each point, when the light emission intensity data at each point is divided by the reference data, the value of the normalized data is substantially close to "1.0".

Specific Example of Processing by Compression Unit

Figure 6:
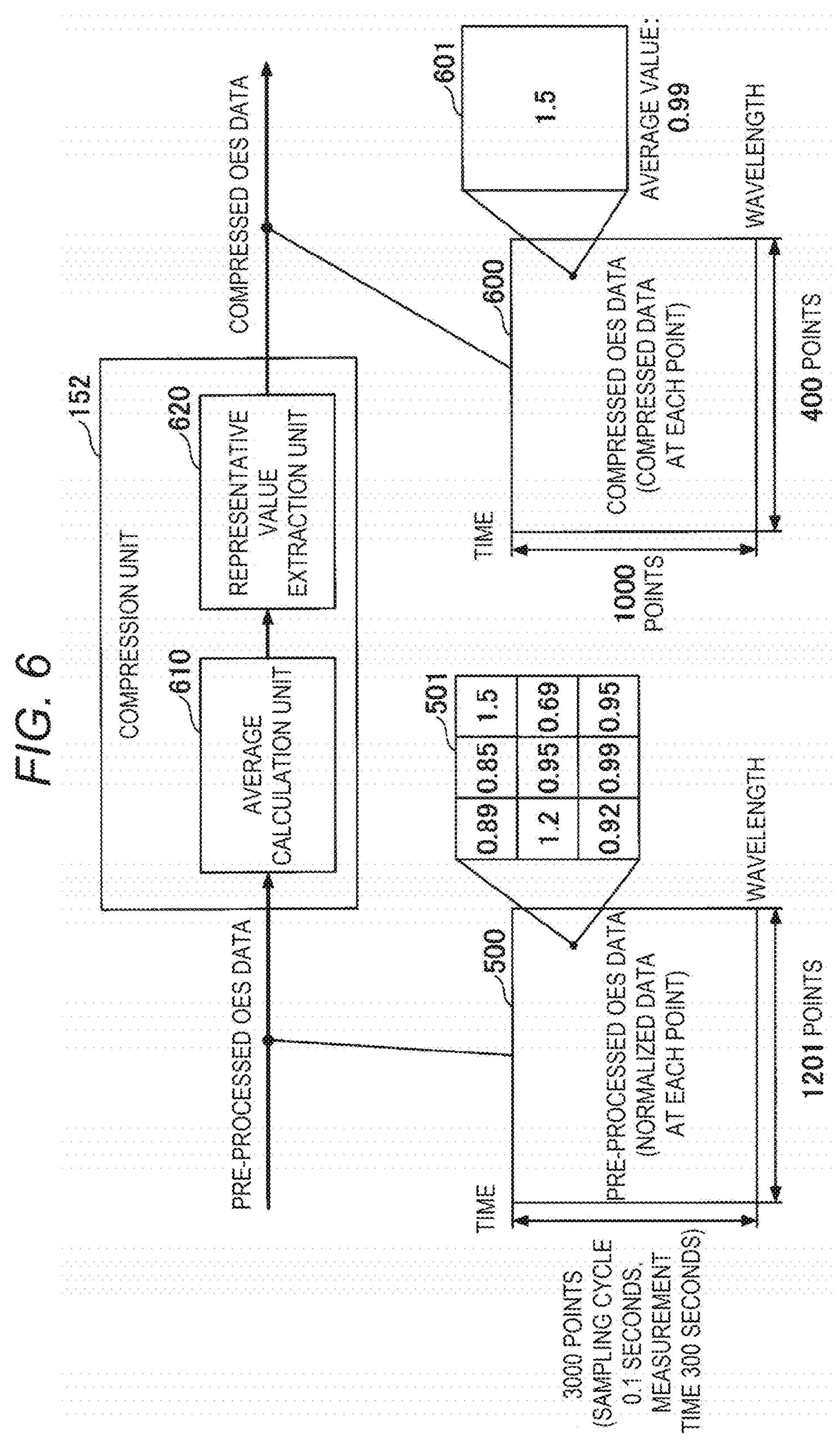
FIG. 6 is a diagram illustrating a specific example of processing by a compression unit.

In the following, a specific example of the processing performed on the pre-processed OES data 500 by the compression unit 152 of the data processing apparatus 150 will be described. FIG. 6 is a diagram illustrating a specific example of processing by a compression unit. As shown in FIG. 6, the compression unit 152 includes an average calculation unit 610 and a representative value extraction unit 620.

The average calculation unit 610 divides the normalized data at each point included in the pre-processed OES data 500 into a plurality of regions of a predetermined size (for example, three points in the horizontal axis direction and three points in the vertical axis direction), and calculates the average value of the normalized data at each point in each region.

The representative value extraction unit 620 compares the difference between the average value calculated in each region and the value of the normalized data (for example, the normalized data at nine points) included in each region, and extracts the value (that is, outlier value) of the normalized data with the largest difference as a representative value of each region.

The example of FIG. 6 illustrates a state where the average calculation unit 610 calculates "0.99" as the average value of the normalized data 501 at nine points included in the region of the predetermined size. In the example of FIG. 6, the representative value extraction unit 620 extracts, as a representative value 601, the value of the normalized data with the largest difference (outlier value="1.5") from the average value ("0.99"), from among the normalized data 501 at nine points included in the region of the predetermined size.

As described above, by extracting the representative value for each region of the predetermined size (three points in the horizontal axis direction and three points in the vertical axis direction), the score of the normalized data included in the pre-processed OES data 500 is compressed to ⅓ in the horizontal axis direction, and is compressed to ⅓ in the vertical axis direction. As a result, as shown in FIG. 6,

- the pre-processed OES data 500 with 1201 points in the horizontal axis direction and the normalized data with 3000 points in the vertical axis direction arranged is compressed to
- the compressed OES data 600 with 400 points in the horizontal axis direction and the compressed data with 1000 points in the vertical axis direction arranged, thereby reducing the management cost.

Specific Example of Image Data

Figure 7:
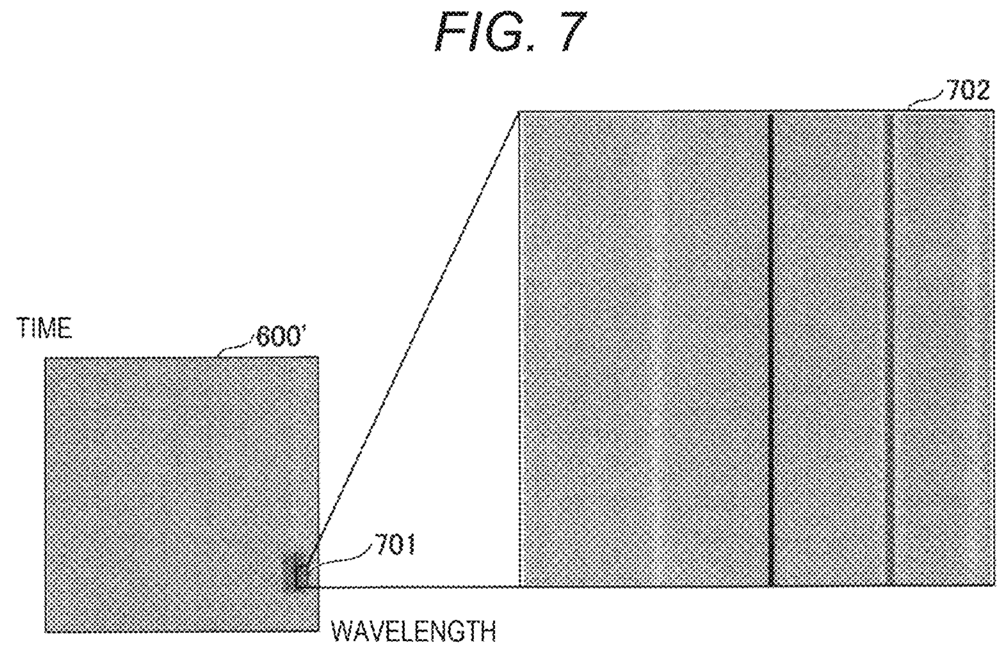
FIG. 7 is a diagram illustrating a specific example of image data.

Next, a specific example of the image data generated by the imaging unit 153 of the data processing apparatus 150 will be described. FIG. 7 is a diagram illustrating a specific example of image data.

In FIG. 7, image data 600' represents a specific example of two-dimensional image data generated by converting compressed data at each point of the compressed OES data 600 notified from the compression unit 152 into color data. In the image data 600', the horizontal axis represents wavelength, and the vertical axis represents time. The difference in color between the individual points indicates the difference in the value of the compressed data, and the example of FIG. 7 illustrates the case where the point where the value of the compressed data is the largest is converted into red, the point where the value of the compressed data is the average is converted into green, and the point where the value of the compressed data is the smallest is converted into blue. The example also illustrates the case where the point where the value of the compressed data falls between the largest and the average is converted into a color between red and green in a hue circle, and the point where the value of the compressed data falls between the average and the smallest is converted into a color between green and blue in the hue circle. However, the assignment of each color to each value of the compressed data is freely selected, and each color may be assigned by another assignment method.

In the case of the image data 600', the loss of feature data is suppressed. Therefore, the user can visually determine the presence or absence of the error occurrence or the like on the image data 600' to be displayed on the display device 306.

Further, as shown in FIG. 7, when a predetermined region 701 of the image data 600' is specified, the imaging unit 153 can enlarge the image data in the predetermined region 701 and display enlarged image data 702. As a result, the user can zoom out the image data 600' or zoom in a specific wavelength range and a specific time range.

In an exemplary implementation, the compressed OES data 600 may be displayed as three-dimensional image data. For example, the compressed OES data 600 may be displayed three-dimensionally with the wavelength on the horizontal axis, the time on the depth axis, and the compressed data value on the height axis. In this case as well, the difference in the value of the compressed data may be expressed as the difference in color.

In an exemplary implementation, excited species (molecules in an excited state) corresponding to the wavelength on the horizontal axis may be displayed together in the image data 600'. As a result, the user can infer the cause of the error.

Flow of Imaging Processing by Data Processing Apparatus

Figure 8:
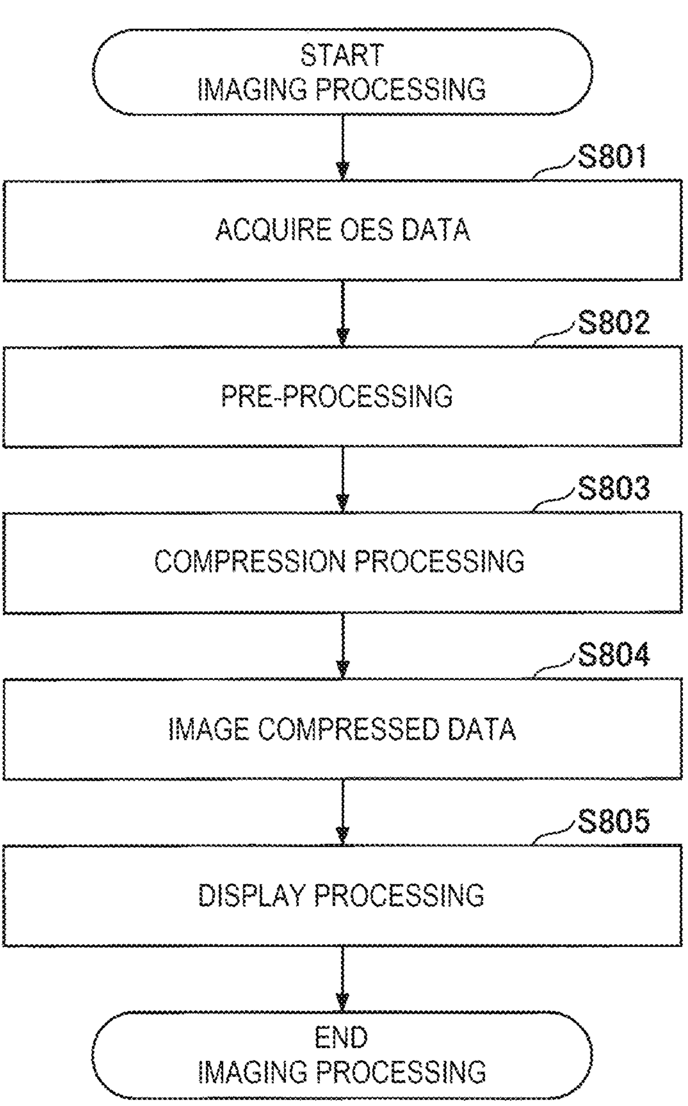
FIG. 8 is a flowchart illustrating a flow of an imaging processing.

In the following, the imaging processing of OES data performed by the data processing apparatus 150 will be described. FIG. 8 is a flowchart illustrating a flow of an imaging processing.

In step S801, the data processing apparatus 150 receives OES data from the light emission spectroscopy analyzer 140 and stores the OES data in the OES data storage unit 155.

In step S802, the pre-processor 151 of the data processing apparatus 150 reads the OES data from the OES data storage unit 155, and performs the pre-processing by dividing the light emission intensity data at each point by the reference data.

In step S803, the compression unit 152 of the data processing apparatus 150 divides the normalized data at each point included in the pre-processed OES data into a plurality of regions for each predetermined size. Further, the compression unit 152 of the data processing apparatus 150 compresses the pre-processed OES data by extracting, as a representative value of each region of a predetermined size, the value of the normalized data (outlier values) with the largest difference from the average value calculated for each region of the predetermined size.

In step S804, the imaging unit 153 of the data processing apparatus 150 converts the compressed data at each point of the compressed OES data into color data, thereby generating image data.

In step S805, the imaging unit 153 of the data processing apparatus 150 displays the image data of the compressed OES data.

<Summary>

As is clear from the above description, the data processing apparatus 150 according to the first embodiment includes the followings:

A pre-processor that divides the light emission intensity data at each point of the OES data by using predetermined reference data and generates normalized data by performing normalization.

A compression unit that divides the pre-processed OES data into a plurality of regions for each predetermined time range and each of a predetermined number of wavelength ranges, and extracts, as a representative value of each region, a value (outlier value) of the normalized data with the largest difference from the average value of each region.

A generator that converts the representative value of each region into color data to generate image data.

As described above, when the OES data is imaged, the normalization is performed, and the compression is performed with the method of extracting the outlier value for each region of the predetermined size, so that the OES data can be compressed without losing the feature data included in the OES data.

In other words, according to the first embodiment, it is possible to provide a data processing apparatus, a data processing system, a data processing method, and a data processing program that compress the OES data with reduced loss of feature data to form an image.

Second Embodiment

The first embodiment has been described with respect to a configuration in which OES data is compressed with reduced loss of feature data to form an image so that the management cost of the OES data is reduced, and that the user can determine the presence or absence of the error occurrence or the like. In contrast, a second embodiment will be described with respect to a configuration in which the presence or absence of the error occurrence or the like is automatically determined by using imaged OES data. The configuration for automatically determining the presence or absence of the error occurrence or the like using the imaged OES data includes, for example:

a configuration for determining whether a corresponding wafer is a non-defective wafer that has been normally processed or includes an error, a configuration for determining whether the corresponding wafer is the non-defective wafer that has been normally processed or is other than the non-defective wafer (at least not the non-defective wafer that has been normally processed), and a configuration for determining whether the corresponding wafer is the non-defective wafer that has been normally processed or includes an error related to which one of the plurality of pattern. The second embodiment will be described with respect to a configuration in which it is automatically determined whether the corresponding wafer is the non-defective wafer that has been normally processed or includes the error related to which one of the plurality of patterns. Hereinafter, the second embodiment will be described with a focus on the differences from the first embodiment.

System Configuration of Data Processing System

Figure 9A:
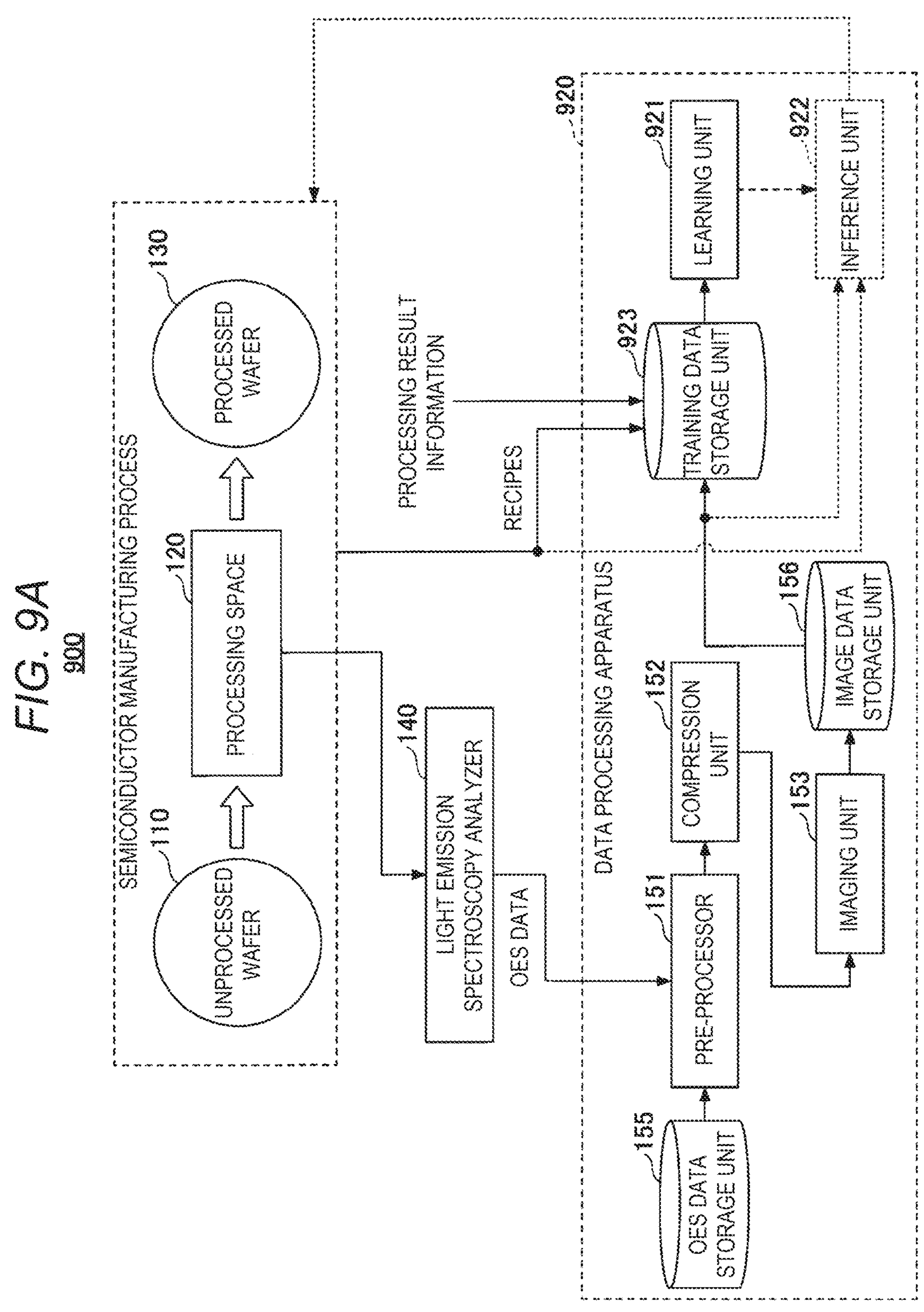
FIG. 9A is a second diagram illustrating an example of the system configuration of the data processing system.

First, the system configuration of a data processing system according to the second embodiment will be described with reference to FIGS. 9A and 9B. FIG. 9A is a second diagram illustrating an example of the system configuration of the data processing system. Specifically, FIG. 9A illustrates an example of the system configuration of the data processing system 900 in the "learning phase" in which a correspondence relationship between image data and corresponding recipes generated by imaging OES data and processing result of the processed wafer is learned.

The data processing system 900 shown in FIG. 1 differs from the data processing system 100 in that a data processing apparatus 920 includes a learning unit 921.

In the data processing system 900, the data processing apparatus 920 acquires processing result information about the processed wafer 130. Various variations may be expected in the processing result information, for example:

information indicating whether the processed wafer 130 is the non-defective wafer that has been normally processed or a state that includes the error, information indicating whether the processed wafer 130 is the non-defective wafer that has been normally processed or is other than the non-defective wafer (at least not the non-defective wafer that has been normally processed), and information indicating whether the processed wafer 130 is the non-defective wafer that has been normally processed or includes the error belonging to which one of the plurality of patterns.

However, among the variations, the present embodiment will describes a case that uses the information indicating whether the processed wafer 130 is the non-defective wafer that has been normally processed or includes the error belonging to which one of the plurality of patterns. The information that may be included in the processing result information may be generated based on, for example, information such as whether the processed wafer is a non-defective wafer or a defective wafer, which is an output obtained when the processed wafer is inspected by an inspection apparatus.

The data processing apparatus 920 stores the acquired processing result information, together with the corresponding recipes and the corresponding image data, as training data in a training data storage unit 923.

The learning unit 921 of the data processing apparatus 920 includes an error detection model that outputs the processing result information of the processed wafer by using image data and recipes as inputs.

Then, the data processing apparatus 920 reads the training data from the training data storage unit 923, and performs learning processing on the error detection model. Specifically, the data processing apparatus 920 inputs recipes and image data into the error detection model, and updates the model parameters of the error detection model such that the output of the error detection model approaches the corresponding processing result information.

Figure 9B:
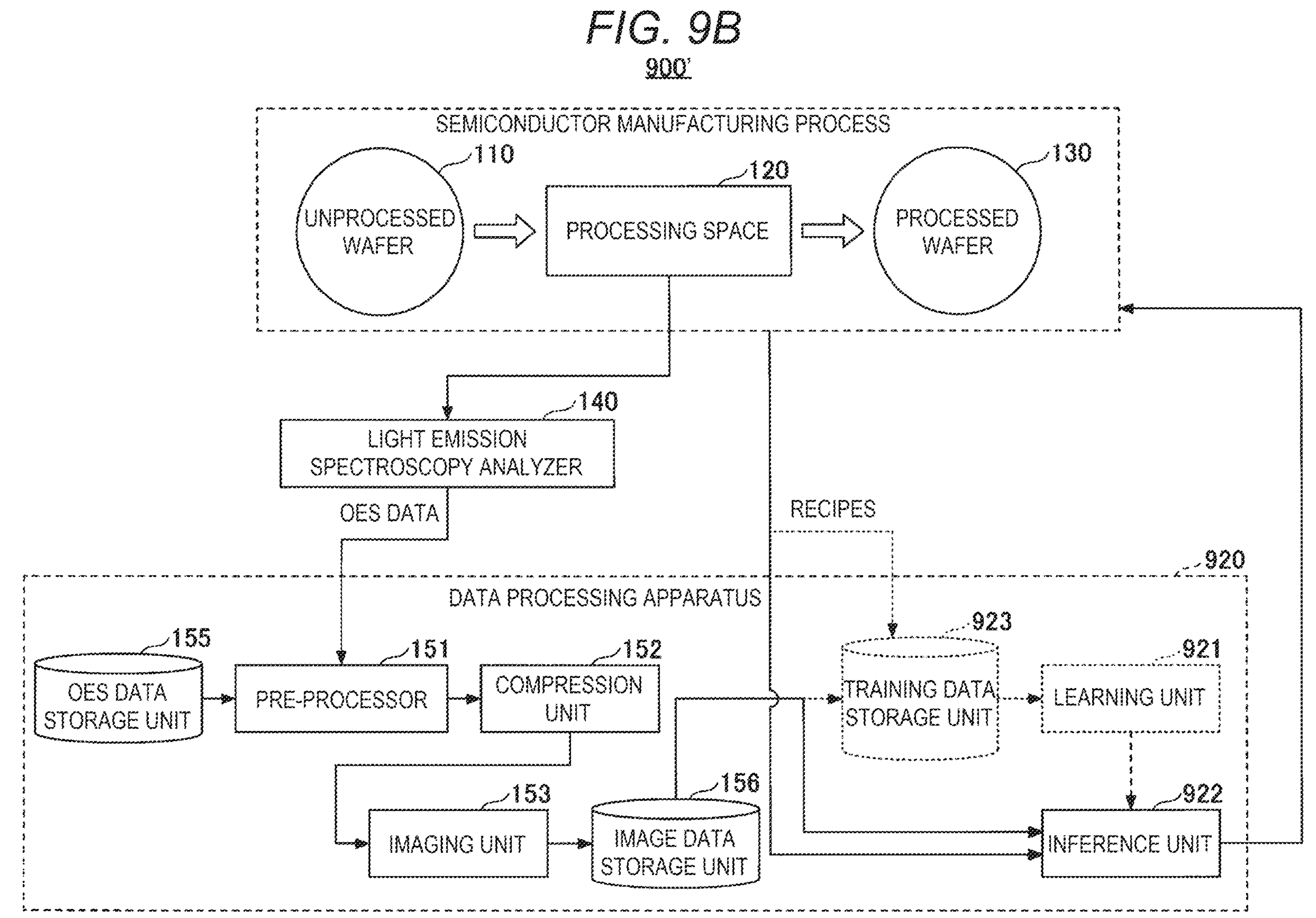
FIG. 9B is a third diagram illustrating an example of the system configuration of the data processing system.

On the other hand, FIG. 9B is a third diagram illustrating an example of the system configuration of the data processing system. Specifically, FIG. 9B illustrates an example of the system configuration of a data processing system 900' in the "inference phase" in which the processing result information of the processed wafer 130 is inferred from image data generated by imaging OES data and corresponding recipes.

The data processing system 900' is different from the data processing system 100 shown in FIG. 1 in that the data processing apparatus 920 includes an inference unit 922.

The inference unit 922 of the data processing apparatus 920 includes the learned error detection model generated through the learning processing performed by the learning unit 921. The inference unit 922 inputs the image data and recipes into the learned error detection model to infer the processing result information of the corresponding processed wafer 130, and outputs the resultant as an inference result. The inference result output from the inference unit 922 may include a variety of variations, for example:

information indicating whether the processed wafer 130 is the non-defective wafer that has been normally processed or includes an error, information indicating whether the processed wafer 130 is the non-defective wafer that has been normally processed or is other than the non-defective wafer (at least not the non-defective wafer that has been normally processed)

information indicating whether the processed wafer 130 is the non-defective wafer that has been normally processed or includes the error belonging to which one of the plurality of patterns.

However, among the variations, the present embodiment will describes a case that outputs the information indicating whether the processed wafer 130 is the non-defective wafer that has been normally processed or includes the error belonging to which one of the plurality of patterns.

Specific Example of Training Data

Next, a specific example of the training data stored in the training data storage unit 923 will be described. As shown in FIG. 10, training data 1000 includes "apparatus", "recipe", "wafer", "image data", and "non-defective/errorous" as information items.

The name of the chamber in which the unprocessed wafer 110 has been processed is stored in the "apparatus." The recipe identifier that identifies the recipe used when the unprocessed wafer 110 is processed in the chamber A is stored in the recipe.

The "wafer" stores a wafer identifier that identifies an unprocessed wafer processed in the chamber A. The "image data" stores an image data identifier that identifies the image data generated by the imaging unit 153 imaging the OES data measured while the corresponding unprocessed wafer is being processed in the chamber A.

The image data to be used for the training data is pre-processed by using as reference data the average value of the light emission intensity data of each wavelength of the OES data measured when the wafer determined to be a non-defective wafer is processed. The image data used for the training data is image data of the processing time (for one wafer) for which the unprocessed wafer 110 is processed in the chamber A.

The "non-defective/errorous" stores the processing result information of the processed wafer 130 generated as a result of the corresponding unprocessed wafer being processed in the chamber A. Specifically, the information is stored therein indicating whether the processed wafer 130 is the non-defective wafer that has been normally processed or includes an error belonging to which one of the plurality of patterns.

The example of FIG. 10 illustrates a state in which "wafer 1" to "wafer 3" are processed by using a "recipe 1" in the "chamber A", respectively to generate "image data 1" to "image data 3" and processing result information ("non-defective") is output.

Further, the example of FIG. 10 illustrates a state in which "wafer 4" is processed by using the "recipe 1" in the "chamber A" to generate "image data 4" and processing result information ("including an error (pattern a)") is output.

Further, the example of FIG. 10 illustrates a state in which wafers 5, 7, and 8 are processed by using a "recipe 2" in the "chamber A" to generate image data 5, 7, and 8 and processing result information ("non-defective") is output.

Further, the example of FIG. 10 illustrates a state in which "wafers 6 and 9" are processed by using the "recipe 2" in the "chamber A" to generate "image data 6 and 9" and processing result information ("including an error (pattern b)" or "including an error (pattern c)") is output.

The patterns (patterns a, b, c, . . . ) that include an error are classified according to the cause of the error in an excited state, for example. The cause of an error includes, for example, information such as which molecule is in an excited state or which part in the chamber is erroneous. That is, according to the learned error detection model which is trained using the training data 1000, it is possible to infer the cause of an error together by inferring the pattern of the error.

Specific Example of Processing by Learning Unit

Figure 11:
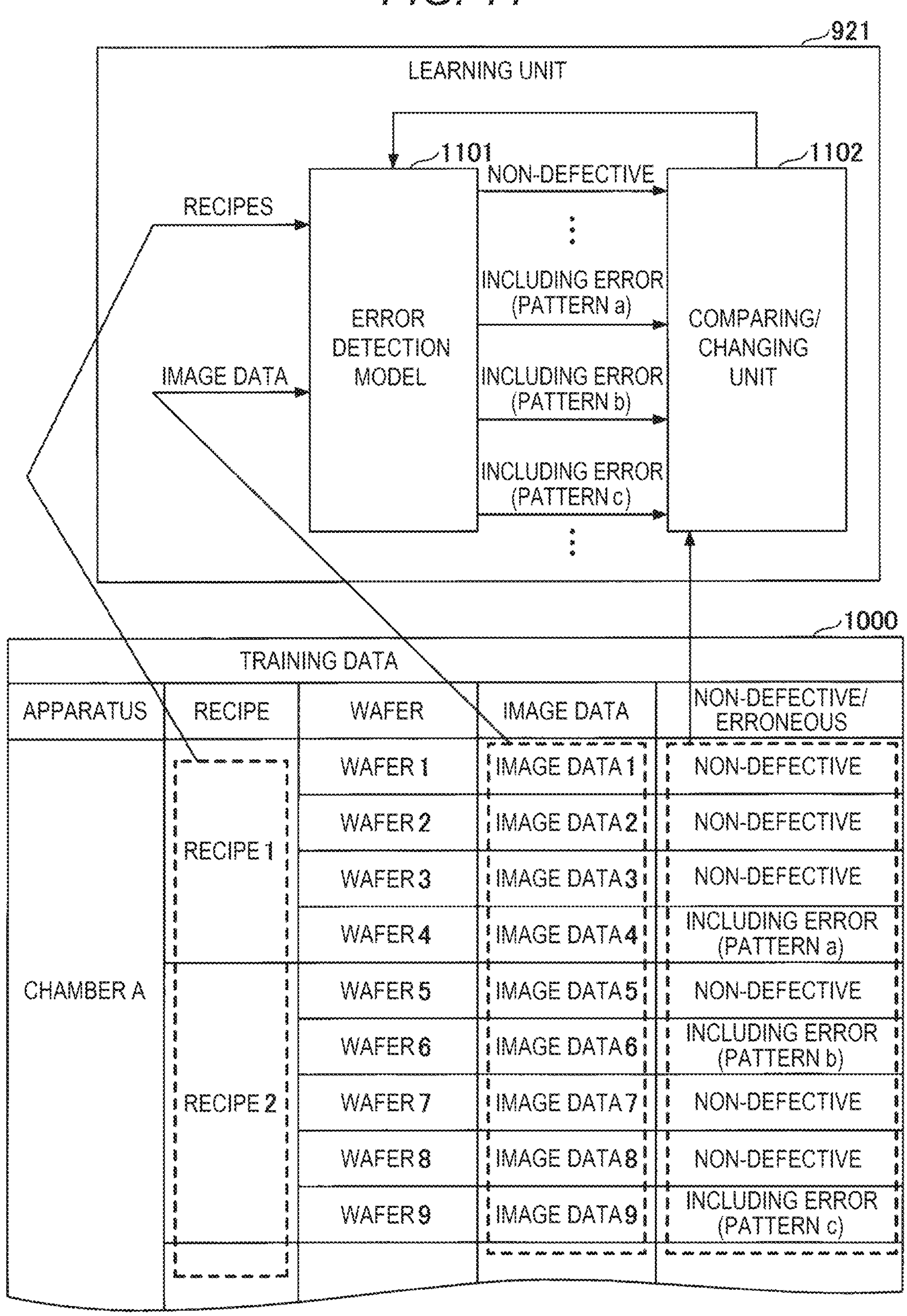
FIG. 11 is a diagram illustrating a specific example of learning processing performed by a learning unit.

In the following, a specific example of the learning processing performed by the learning unit 921 of the data processing apparatus 920 will be described. FIG. 11 is a diagram illustrating a specific example of learning processing performed by a learning unit. As shown in FIG. 11, the learning unit 921 includes an error detection model 1101 and a comparing/changing unit 1102.

The learning unit 921 reads recipes (for example, recipe specified by the recipe identifier="recipe 1") and image data (for example, image data specified by the image data identifier="image data 1") from the "recipes" and the "image data" in the training data 1000.

Further, the learning unit 921 inputs recipes and image data read from the training data 1000 into the error detection model 1101, thereby executing the error detection model 1101 and outputting the probability distribution of the processing result information.

The probability distribution of the processing result information output from the error detection model 1101 is input to the comparing/changing unit 1102, and compared with the probability distribution of the processing result information read from the "non-defective/errorous" portion of the training data 1000. For example, when "non-defective" is read from "non-defective/errorous" portion of the training data 1000, the probability distribution of the processing result information output from the error detection model 1101 is compared with the probability distribution that "non-defective"=100% and other processing result information=0%."

The comparing/changing unit 1102 updates the model parameters of the error detection model 1101 based on the comparison result. As a result, the learning unit 921 can update the model parameters of the error detection model 1101 such that the output obtained when the recipes and the image data are input approaches the processing result information stored in the "non-defective/errorous" portion of the training data 1000.

Specific Examples of Inference Processing by Inference Unit

Figure 12:
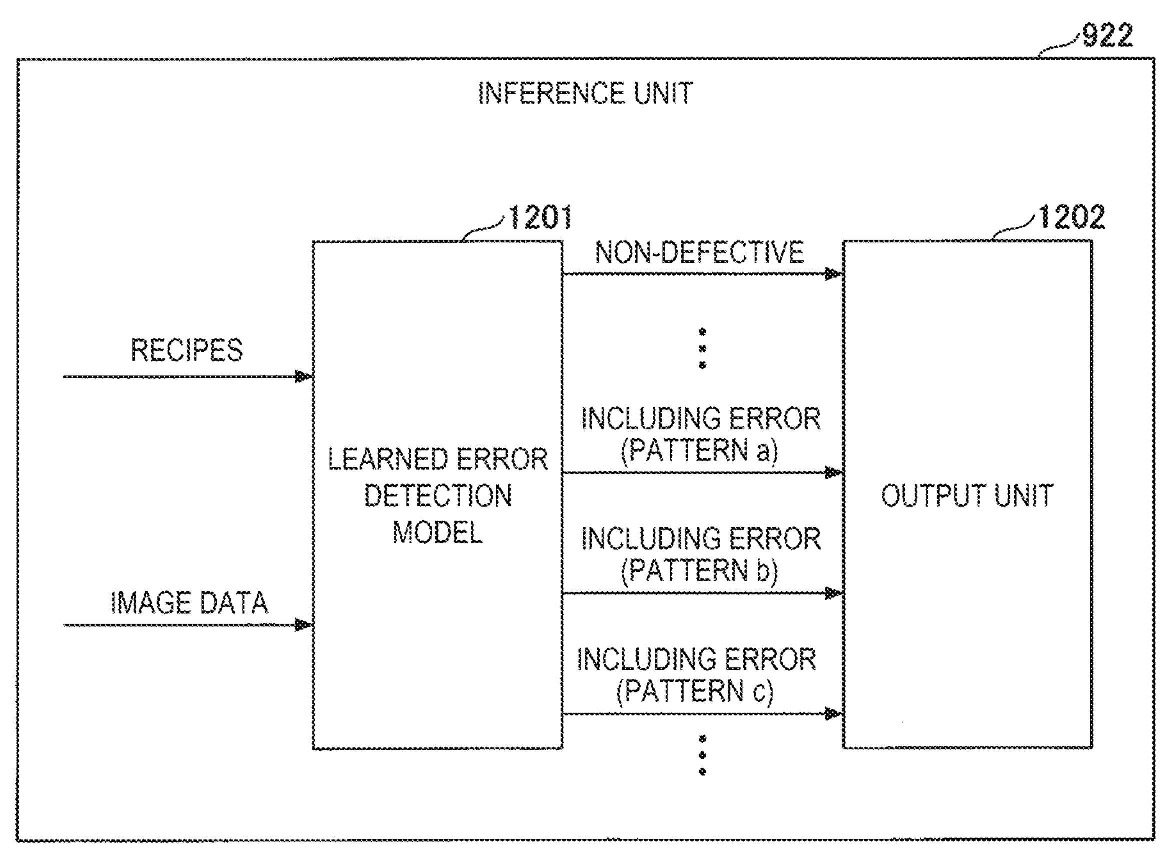
FIG. 12 is a diagram illustrating a specific example of inference processing by an inference unit.

Next, a specific example of the inference processing performed by the inference unit 922 of the data processing apparatus 920 will be described. FIG. 12 is a diagram illustrating a specific example of inference processing by an inference unit. As shown in FIG. 12, the inference unit 922 includes a learned error detection model 1201 (a learned error detection model generated by performing learning processing on the error detection model 1101) and an output unit 1202.

The inference unit 922 acquires recipes used when the unprocessed wafer 110 is processed in the chamber A, and image data generated from OES data measured during the processing of the unprocessed wafer 110 in the chamber A, and inputs these data into the learned error detection model 1201.

When the recipes and the image data are input by the inference unit 922, the learned error detection model 1201 outputs a probability distribution of the processing result information.

When the probability distribution of the processing result information is output from the learned error detection model 1201, the output unit 1202 outputs processing result information corresponding to the largest probability distribution out of the probability distributions that are equal to or more than a predetermined threshold value. For example, when the probability distribution of "non-defective" is equal to or more than a predetermined threshold value and is the largest, the output unit 1202 outputs, as an inference result, information indicating that the processed wafer 130 is the non-defective wafer for which processing has been normally performed.

For example, when the probability distribution of "including an error (pattern a)" is equal to or more than a predetermined threshold value and is the largest, the output unit 1202 outputs, as the inference result, information indicating that the processed wafer 130 includes an error belonging to the pattern a and information indicating the cause of the error. Further, the output unit 1202 may be configured to output an optimal recipe, in addition to the inference result.

Flow of Error Detection Processing

Figure 13:
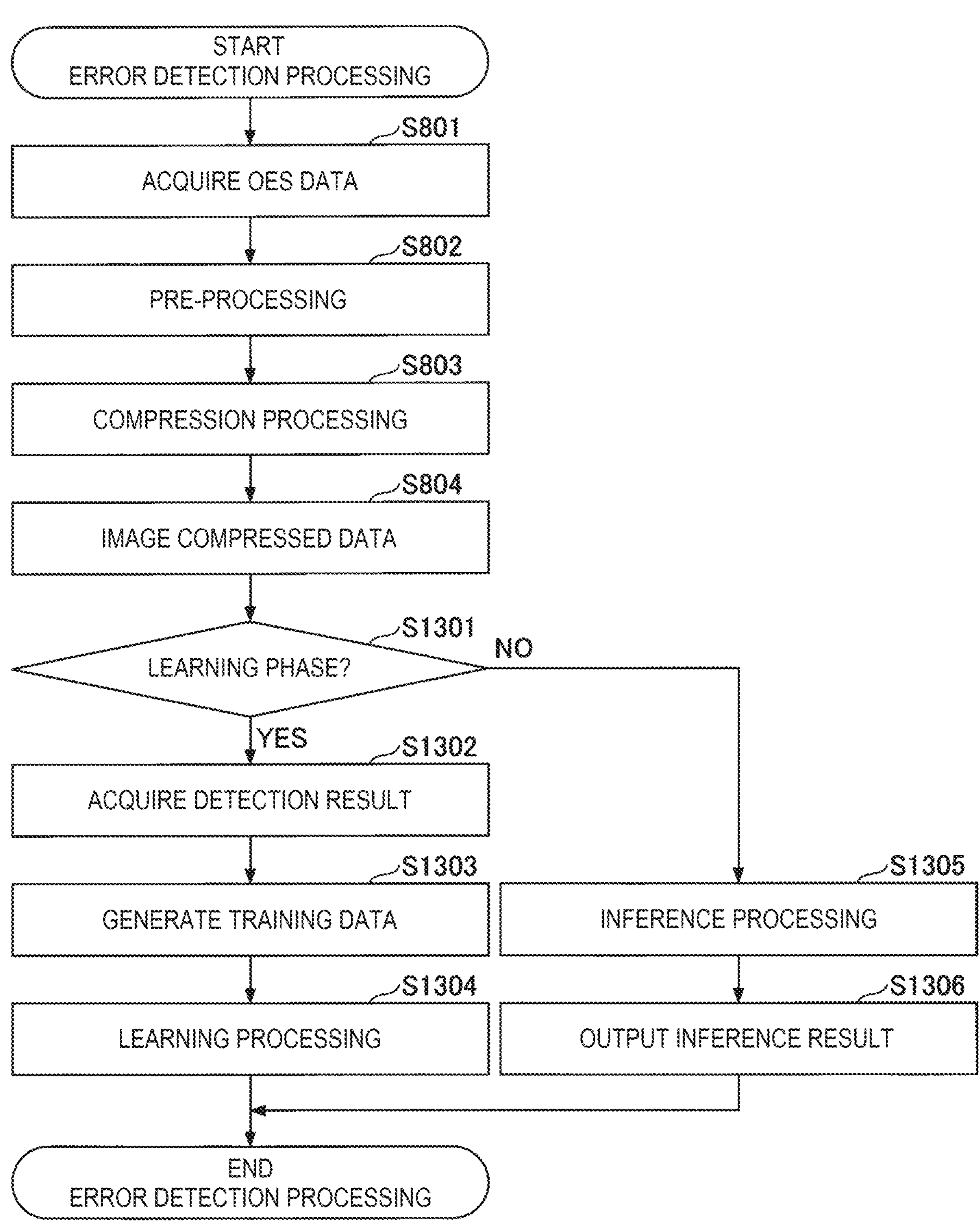
FIG. 13 is a flowchart illustrating a flow of error detection processing.

Next, the flow of the error detection processing performed by the data processing systems 900 and 900' will be described. FIG. 13 is a flowchart illustrating a flow of error detection processing. Among steps illustrated in FIG. 13, the steps illustrated in steps S801 to S804 are the same as the steps illustrated in steps S801 to S804 of FIG. 8, and thus the description thereof will be omitted.

In step S1301, the data processing apparatus 920 determines whether the current phase is the learning phase or an inference phase. Upon determining in step S1301 that the current phase is the learning phase (YES in step S1301), the processing proceeds to step S1302.

In step S1302, the data processing apparatus 920 acquires processing result information and acquires the corresponding recipe.

In step S1303, the data processing apparatus 920 associates the acquired processing result information, the recipe, and the image data with each other to generate training data, and stores the training data in the training data storage unit 923.

In step S1304, the learning unit 921 of the data processing apparatus 920 uses the training data to perform learning processing on the error detection model, thereby generating a learned error detection model, and then ends the error detection processing.

Upon determining in step S1301 that the current phase is an inference phase (NO in step S1301), the processing proceeds to step S1305.

In step S1305, the inference unit 922 of the data processing apparatus 920 inputs the image data and recipes into the learned error detection model 1201, and outputs the probability distribution of the processing result information.

In step S1306, the inference unit 922 of the data processing apparatus 920 transmits the inference result output from the output unit 1202 to the semiconductor manufacturing process based on the probability distribution of the processing result information output from the learned error detection model 1201.

SUMMARY

As is clear from the above description, the data processing apparatus 920 according to the second embodiment includes the followings:

An error detection model that learns the correspondence relationship between image data and recipes generated by imaging OES data, and processing result information of a processed wafer.

A learned error detection model that is generated by performing learning processing on the error detection model by using training data.

The image data generated by imaging the OES data, and recipes are input into the learned error detection model, thereby inferring processing result information of the processed wafer.

As described above, with a configuration that infers the processing result information of the processed wafer by using image data, according to the second embodiment, it is possible to automatically determine the presence of absence of the error occurrence.

Third Embodiment

The second embodiment has been described with respect to a case in which a data processing apparatus is installed for each processing space, and a learned error detection model is generated for each data processing apparatus by using training data generated for each data processing apparatus. In contrast, in the third embodiment, the server apparatus collects training data generated for each data processing apparatus to perform learning processing.

As a result, according to the third embodiment, it is possible to provide a learned error detection model generated by performing learning processing by using a larger amount of training data.

Hereinafter, the third embodiment will be described with a focus on the differences from the first and second embodiments.

System Configuration of Data Processing System

Figure 14:
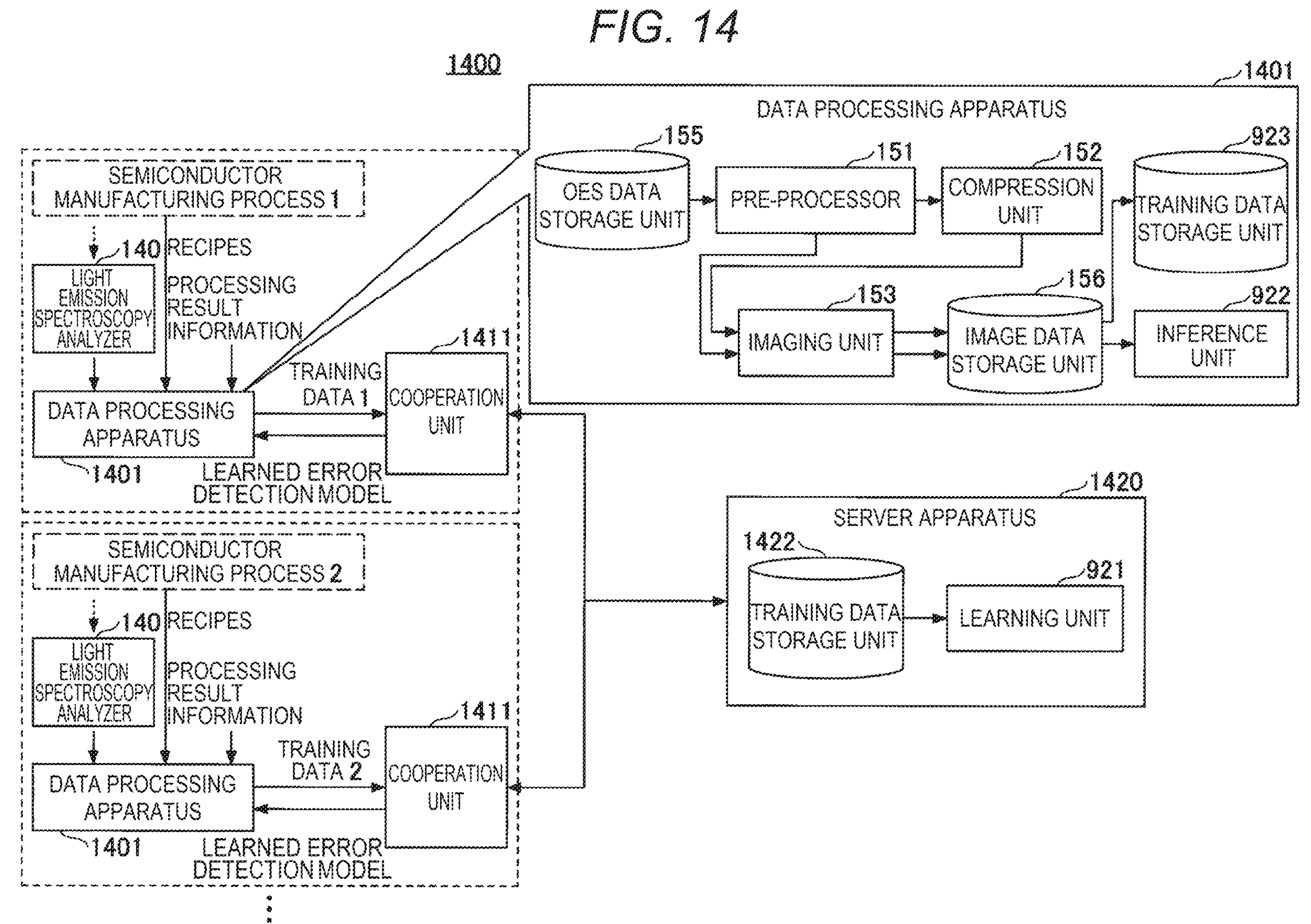
FIG. 14 is a fourth diagram illustrating an example of the system configuration of the data processing system.

First, the system configuration of a data processing system according to a third embodiment will be described. FIG. 14 is a fourth diagram illustrating an example of the system configuration of the data processing system.

As shown in FIG. 14, the data processing system 1400 includes a plurality of semiconductor manufacturing processes, and a light emission spectroscopy analyzer 140, a data processing apparatus 1401, a cooperation unit 1411, and a server apparatus 1420 corresponding to each semiconductor manufacturing process.

The light emission spectroscopy analyzer 140 has already been described, and thus the description thereof will be omitted.

The data processing apparatus 1401 includes a pre-processor 151, a compression unit 152, an imaging unit 153, and an inference unit 922. The pre-processor 151, the compression unit 152, the imaging unit 153, and the inference unit 922 included in the data processing apparatus 1401 have been described with reference to FIGS. 9A and 9B, and thus description thereof will be omitted.

The data processing apparatus 1401 also includes an OES data storage unit 155 that stores OES data measured by the light emission spectroscopy analyzer 140, and an image data storage unit 156 that stores image data generated by the imaging unit 153. The data processing apparatus 1401 further includes the training data storage unit 923 that stores image data, processing result information, and recipes in association with each other as training data. The OES data storage unit 155, the image data storage unit 156, and the training data storage unit 923 have also been described, and thus the description thereof will be omitted.

The cooperation unit 1411 reads the training data (for example, training data 1) stored in the training data storage unit 923, and transmits the data to the server apparatus 1420. Since the image data included in the training data transmitted and received between the cooperation unit 1411 and the server apparatus 1420 is compressed, the amount of communication can be reduced compared to the case of transmitting and receiving the OES data itself.

The cooperation unit 1411 also applies the learned error detection model acquired from the server apparatus 1420 to the inference unit 922 in response to the transmission of the training data to the server apparatus 1420. Accordingly, the inference unit 922 can perform inference by using the learned error detection model common to each semiconductor manufacturing process generated in the server apparatus 1420.

When training data is transmitted from each cooperation unit 1411 corresponding to each semiconductor manufacturing process, the server apparatus 1420 stores the training data in a training data storage unit 1422. Further, the server apparatus 1420 includes the learning unit 921.

The learning unit 921 uses the training data stored in the training data storage unit 1422 to perform learning processing on the error detection model of the learning unit 921. As a result, the learning unit 921 can generate a common learned error detection model that is applied to each semiconductor manufacturing process.

The server apparatus 1420 transmits the learned error detection model generated by the learning unit 921 to each cooperation unit 1411 corresponding to each semiconductor manufacturing process.

SUMMARY

As is clear from the above description, in the third embodiment, the learning unit 921 and the inference unit 922 are separate from each other, and the training data acquired in the respective semiconductor manufacturing processes are collected to generate a common learned error detection model.

As a result, according to the third embodiment, it is possible to generate a learned error detection model that does not depend on individual differences in the semiconductor manufacturing process.

Fourth Embodiment

The first to third embodiments have been described by using OES data as time series data of multiple wavelengths measured along with the processing of the unprocessed wafer 110 in the processing space of a semiconductor manufacturing process. However, the time series data of multiple wavelengths measured along with the processing of the unprocessed wafer 110 in the processing space of the semiconductor manufacturing process is not limited to the OES data, and may be, for example, mass spectrometric data measured by a mass spectrometer that analyzes gases in a chamber. Alternatively, reflected light data may be used by measuring reflected light when the reflected light is projected onto the wafer surface from an external light source of a chamber.

Further, in the first embodiment, as the region of the predetermined size, a region of three points in the horizontal axis direction and a region of three points in the vertical axis direction have been described as an example, but the region of the predetermined size is not limited thereto. Further, the shape of the region of a predetermined size is not limited to a square, and may be different from the number of points in the horizontal axis direction and the number of points in the vertical axis direction.

The first embodiment has been described with respect to a case in which the imaging unit 153 images the compressed OES data compressed by the compression unit 152 and stores the resultant in the image data storage unit 156. However, in some cases, the data processing apparatus 150 may require management of uncompressed OES data (pre-processed OES data) or OES data before pre-processing (original OES data) for a certain period of time in operation. Therefore, in addition to the functions described in the first embodiment, the imaging unit 153 of the data processing apparatus 150 may have, for example, a function of imaging original OES data, a function of imaging pre-processed OES data, or the like. Further, the imaging unit 153 may have a function of performing image compression processing such as JPEG compression on the image data and storing the processed image data in the image data storage unit 156.

The second and third embodiments have been described with respect to the cases in which the recipes and image data are input into the error detection model, but only the image data may be input into the error detection model. Alternatively, in addition to the recipes and the image data, data other than the recipes and the image data may be input into the error detection model.

The third embodiment has been described with respect to the case in which the server apparatus 1420 collects the training data generated by the data processing apparatus 1401 corresponding to the plurality of semiconductor manufacturing processes. However, the training data may be mutually transmitted and received between the data processing apparatuses via the server apparatus 1420 (or directly). In this case, the cooperation unit 1411 adds the training data (for example, training data 2) received from the cooperation unit 1411 of the other semiconductor manufacturing process to the training data storage unit 923. As a result, the learning unit 921 can perform learning processing for the error detection model by using, in addition to the training data acquired from the corresponding semiconductor manufacturing process (for example, training data 1), the training data acquired from another semiconductor manufacturing process (for example, training data 2). In other words, the learning unit 921 can perform learning processing for events that have not occurred in the corresponding semiconductor manufacturing process. The learned error detection model generated in this way may be applied to other semiconductor manufacturing processes by mutually transmitting and receiving the error detection model between the data processing apparatuses via the server apparatus 1420 (or directly). In other words, the learned error detection model generated in any semiconductor manufacturing process may be horizontally expanded to another semiconductor manufacturing process via the server apparatus 1420 (or directly).

The third embodiment has been described with respect to the case in which the server apparatus 1420 includes the learning unit 921 and provides the generated learned error detection model to the data processing apparatus 1401. However, an inference unit to which the generated learned error detection model is applied may be placed in the server apparatus 1420. In this case, upon receiving the image data and recipes from the cooperation unit 1411 corresponding to any of the semiconductor manufacturing processes, the server apparatus 1420 transmits the inference result based on the received image data and recipes to the corresponding cooperation unit 1411. In other words, by placing the generated learned error detection model in the server apparatus 1420 in an executable manner, the learned error detection model may be shared among the semiconductor manufacturing processes.

The present invention is not limited to the configurations described in connection with the embodiments that have been described heretofore, or to the combinations of these configurations with other elements. Various variations and modifications may be made without departing from the scope of the present invention, and may be adopted according to applications.

REFERENCE SIGNS LIST

100: data processing system
110: unprocessed wafer
120: processing space
121/122/123: chamber
130: processed wafer
140: light emission spectroscopy analyzer
150: data processing apparatus
151: pre-processor
152: compression unit
153: imaging unit
154: display controller
155: OES data storage component
156: image data storage unit
420: OES data
500: pre-processed OES data
510: normalization processor
600: compressed OES data
610: average calculation unit
620: representative value extraction unit
500': image data
600': image data
910: inspection apparatus
920: data processing apparatus
921: learning unit
922: inference unit
1000: training data
1101: error detection model
1201: learned error detection model
1400: data processing system
1401: data processing apparatus
1411: cooperation unit
1420: server apparatus

The invention claimed is:

1. A data processing apparatus, comprising:
processing circuitry configured to
generate normalized data by normalizing time series data of multiple wavelengths, measured from a substrate, by using predetermined reference data;
divide the normalized data into a plurality of regions for each predetermined time range and predetermined wavelength range;
for each respective region of the plurality of regions;
calculate an average value of the normalized data included in the respective region; and
extract an outlier value, from the normalized data included in the respective region, that has a largest difference from the average value as a representative value for the respective region; and
convert the representative values from the plurality of regions into color data to generate image data from the color data.

2. The data processing apparatus according to claim 1, wherein the processing circuitry normalizes the time series data of the multiple wavelengths by using, as the predetermined reference data, time series data of the multiple wavelengths when the substrate serving as a reference is processed in a semiconductor manufacturing process.

3. The data processing apparatus according to claim 1, wherein the time series data of the multiple wavelengths is data measured by a light emission spectroscopy analyzer or a mass spectrometer during processing of the substrate in a semiconductor manufacturing process.

4. The data processing apparatus according to claim 3, wherein the processing circuitry is further configured to input the image data into a model, which is trained using a correspondence relationship with a processing result of processing the substrate, to infer the processing result of processing the substrate.

5. The data processing apparatus according to claim 4, wherein the processing circuitry infers that the substrate includes an error and a cause of the error of processing the substrate.

6. The data processing apparatus according to claim 4, wherein the processing circuitry is further configured to perform learning processing on the model such that an output, obtained when the image data generated based on the time series data of the multiple wavelengths measured during the processing of the substrate is input into the model, approaches the processing result of processing the substrate.

7. A data processing system, comprising:
a plurality of the data processing apparatuses according to claim 4; and
a server apparatus configured to receive, from one or more data processing apparatuses of the plurality of data processing apparatuses, any of
the image data generated based on the time series data of the multiple wavelengths measured during processing of the substrate, or
the model trained using the correspondence relationship between the image data and the processing result of processing the substrate.

8. A data processing system, comprising:
the data processing apparatus according to claim 4; and
a server apparatus including learning circuitry configured to perform learning processing on the model such that an output, obtained when image data generated based on the time series data of the multiple wavelengths measured during processing of the substrate is input into the model, approaches the processing result of processing the substrate.

9. A data processing method, comprising:
generating normalized data by normalizing time series data of multiple wavelengths, measured from a substrate, by using predetermined reference data;
dividing the normalized data into a plurality of regions for each predetermined time range and predetermined wavelength range;
for each respective region of the plurality of regions:
calculating an average value of the normalized data included in the respective region; and
extracting an outlier value, from the normalized data included in the respective region, that has a largest difference from the average value as a representative value for the respective region; and converting the representative values from the plurality of regions into color data to generate image data from the color data.

10. The data processing method according to claim 9, wherein in the time series data of the multiple wavelengths is normalized by using, as the predetermined reference data, time series data of the multiple wavelengths when the substrate serving as a reference is processed in a semiconductor manufacturing process.

11. The data processing method according to claim 9, wherein the time series data of the multiple wavelengths is data measured by a light emission spectroscopy analyzer or a mass spectrometer during processing of the substrate in a semiconductor manufacturing process.

12. The data processing method according to claim 11, further comprising inputting the image data into a model, which is trained using a correspondence relationship with a processing result of processing the substrate, to infer the processing result of processing the substrate.

13. The data processing method according to claim 12, wherein the processing result indicates whether an error occurred and a cause of the error of processing the substrate.

14. The data processing method according to claim 12, further comprising performing learning processing on the model such that an output, obtained when the image data generated based on the time series data of the multiple wavelengths measured during the processing of the substrate is input into the model, approaches the processing result of processing the substrate.

15. A non-transitory computer readable medium storing computer executable instructions which, when executed by processing circuitry, cause the processing circuitry to:

generate normalized data by normalizing time series data of multiple wavelengths, measured from a substrate, by using predetermined reference data;

divide the normalized data into a plurality of regions for each predetermined time range and predetermined wavelength range;

for each respective region of the plurality of regions:

calculate an average value of the normalized data included in the respective region; and extract an outlier value, from the normalized data included in the respective region, that has a largest difference from the average value as a representative value for the respective region; and convert the representative values from the plurality of regions into color data to generate image data from the color data.

16. The non-transitory computer readable medium according to claim 15, wherein the processing circuitry is further caused to normalize the time series data of the multiple wavelengths by using, as the predetermined reference data, time series data of the multiple wavelengths when the substrate serving as a reference is processed in a semiconductor manufacturing process.

17. The non-transitory computer readable medium according to claim 15, wherein the time series data of the multiple wavelengths is data measured by a light emission spectroscopy analyzer or a mass spectrometer during processing of the substrate in a semiconductor manufacturing process.

* * * * *